United States Patent [19]
Magnusson et al.

[11] Patent Number: 5,216,680
[45] Date of Patent: Jun. 1, 1993

[54] OPTICAL GUIDED-MODE RESONANCE FILTER

[75] Inventors: Robert Magnusson; Shu-Shaw Wang, both of Arlington, Tex.

[73] Assignee: Board of Regents, The University of Texas System, Austin, Tex.

[21] Appl. No.: 728,673

[22] Filed: Jul. 11, 1991

[51] Int. Cl.$^5$ .............................................. H01S 3/10
[52] U.S. Cl. ..................................... 372/20; 372/102; 372/96; 372/7; 385/37
[58] Field of Search ................ 372/20, 18, 102, 96, 372/7; 359/341; 385/37

[56] References Cited

U.S. PATENT DOCUMENTS

| | | | |
|---|---|---|---|
| 3,868,589 | 2/1975 | Wang | 372/96 |
| 4,328,468 | 5/1982 | Krawczak et al. | 372/102 |
| 4,873,692 | 10/1989 | Johnson et al. | 372/102 |
| 5,090,017 | 2/1992 | Mendenhall et al. | 372/94 |

OTHER PUBLICATIONS

Wang et al; "Guided-Mode Resonances in Planar Dielectric-Layer Diffraction Gratings"; J. Opt. Soc. Am A; vol. 7 No. 8 Aug. '1990.

*Primary Examiner*—Léon Scott, Jr.
*Attorney, Agent, or Firm*—Arnold, White & Durkee

[57] ABSTRACT

A guided-mode resonance filer is provided which can be used as an optical filter with very narrow line width and as an efficient optical switch. Diffraction efficiencies and passband frequencies are calculated based on guided-mode resonance properties of periodic dielectric structures in a waveguide geometry. The guided-mode resonance filter preferably includes means for changing various parameters within the grating so as to change passband frequencies in response thereto. Also, the present invention envisions a narrowband tuneable laser having a diffraction grating of the present invention placed within a laser cavity to provide narrowband optical wave output from the narrowband tuneable laser In another preferred embodiment, the present diffraction grating can be supported by a semiconductor substrate, preferably adjacent to a semiconductor laser for fine-tuning the output of the semiconductor laser. In still another preferred embodiment, the present diffraction grating can be placed between thin-film layers to enhance thin-film performance characteristics.

23 Claims, 3 Drawing Sheets

OPTICAL GUIDED-MODE RESONANCE FILTER

BACKGROUND OF THE INVENTION

I. Field of the Invention

This invention relates to guided-mode resonance filters for producing narrowband optical radiation.

II. Description of Relevant Art

Methods of dispersing wave energy are known in the art. In particular, periodic elements, such as gratings, have been used to diffract wave energy, e g., such as light incident on the element. Diffraction gratings can be used to influence the amplitude, phase, direction, polarization, spectral composition, and energy distribution of a beam of light. Examples of classical applications of gratings include deflection, coupling, filtering, multiplexing, guidance, and modulation of optical beams in areas such as holography, integrated optics, optical communications, acousto-optics, nonlinear optics, and spectroscopy.

When light is incident on the ruled surface of a diffraction grating, it may be reflected (or backward diffracted) and transmitted (or forward diffracted) at angles that depend upon the spacing between the grooves of the grating, the angle of incidence, and the wavelength of the light. By the process of diffraction, light can be separated into its component wavelengths thereby forming a spectrum that can be observed, photographed, or scanned photoelectrically or thermoelectrically. Gratings are therefore used in common instruments such as spectroscopes, spectrometers, and spectrographs.

For gratings to be of practical use as filtering elements and for other applications, it is necessary to accurately predict the passband frequencies for the diffracted spectrum of output waves. Thus, accurate modeling analysis must be performed upon each specific grating in order to determine its diffraction efficiency at various incident wavelengths as well as with respect to other physical parameters. Diffraction efficiency, defined as the diffracted power of a given order divided by the input power, is optimally one (1) or 100% for a lossless diffraction filter grating. However, diffraction efficiency for the reflected wave can be maximized at a different wavelength than that of the transmitted wave. Accordingly, it is necessary to determine the maximum efficiencies and passband for both the reflected wave and the transmitted wave emanating from and through the grating.

In order to predict passband efficiencies, numerous modeling techniques have been attempted. In general, the efficiency of a grating varies smoothly from one wavelength to another. However, there can be localized troughs or ridges in the efficiency curve and these are observed as rapid variations of efficiency with a small change in either wavelength or angle of incidence. These troughs or ridges are sometimes called "anomalies". From the point of view of a spectroscopist, anomalies are a nuisance because they introduce spurious peaks and troughs into the observed spectrum. It is, therefore, very important that the positions and shapes of the anomalies be accurately predicted as well as the conditions under which they appear. Accordingly, previous modeling techniques have attempted to predict the position, magnitude, etc. of various anomalies which exist in diffraction gratings. A good overview of anomalies and their characteristics for optical reflection gratings is provided by A. Hessel and A. Oliner, "A New Theory of Wood's Anomalies on Optical Gratings," *Applied Optics*, Vol. 4, No. 10, pp. 1275–1297 (October, 1965).

Recently, there have been increased efforts to accurately predict this natural phenomenon called anomalies. As Hessel and Oliner point out, there are basically two types of anomalous effects. First, there is a Rayleigh type effect due to one of the spectral orders appearing at the grazing angle. Thus, anomalies occur when an order "passes off" over the grating horizon when, e.g., the angle of refraction is 90°. Thus, at the wavelength at which an order is grazing the surface, or the so-called Rayleigh wavelength, there is a discontinuity in the number of orders that are allowed to propagate. The energy that is in the order which "passes off" has to be redistributed among the other orders and this accounts for the sudden fluctuations in the efficiency of these orders. Thus, an explanation exists for describing the position of the anomalies existing due to the Rayleigh effect. The second type of anomalous effect deals with a resonance-type effect caused by possible guided waves supported by the grating. This second form of anomaly depends upon the parameters of the grating, i.e. its thickness, permittivity, grating period, and also upon the wavelength and angle of incidence, etc. of the light wave as in the Rayleigh effect.

This secondary effect, dubbed "resonance effect" was studied by Hessel and Oliner. They presented calculated results for reflection gratings which accurately predicted the diffraction efficiency. However, the gratings previously studied were generally planar reflection gratings with the periodic structure modeled as a grating surface reactance function. They did not contain dielectric surface structures and/or transmissive structures added for support of a relatively thin grating element. A large commercial market currently exists for thin dielectric diffraction gratings, or diffraction gratings which can be placed on a semiconductor surface adjacent a semiconductor laser.

In order to make diffraction gratings acceptable for commercial markets, it is essential that an exact electromagnetic model be utilized in order to fully characterize the anomaly phenomenon. Simplified theories, used for many years, cannot describe resonance filtering characteristics of devices such as guided-mode resonance filters. In M. Moharam and T. Gaylord, "Rigorous Coupled-Wave Analysis of Planar-Grating Diffraction," *Journal of the Optical Society of America*, Vol. 71, No. 7, pp. 811–818, (July, 1981), a rigorous coupled-wave approach was used to model slanted gratings. As recently discovered, rigorous coupled-wave analysis also allows for accurate prediction of the anomalies solvable by equations formulated into a simple matrix form. A computer can thereby be used to provide an exact and rigorous prediction of anomalies based upon both the first and second types of anomalous effects. See, e.g., S.S. Wang, et al., "Guided-Mode Resonances in Planar Dielectric-Layer Diffraction Gratings," *Journal of the Optical Society of America*, A, Vol. 7, No. 8, pp. 1470–1474, (August, 1990).

Rigorous coupled-wave analysis provides an exact prediction of the location and magnitude of each anomaly and can, therefore, be used to model the guided-mode resonance filters for practical applications. S.S. Wang et al. article describes the rigorous coupled-wave analysis, but along with the Moharam and Gaylord reference cited above, S. S. Wang et al. does not disclose a guided-mode resonance filter.

SUMMARY OF THE INVENTION

The problems outlined above are in large measure solved by the device and method of the present invention. That is, a tuneable guided-mode resonance filter according to the present invention provides a predictable anomalous effect such that an accurate passband having known diffraction efficiency can be designed. The guided-mode resonance filter of the present invention is particularly appropriate as a substantially lossless spectral filter (both static and tuneable) with arbitrarily narrow linewidths. Using a high spatial frequency dielectric grating of the present invention may lead to 100% reflective narrowband spectrally selective mirror. The narrowband filter, possibly configured as a reflective mirror, can thereby be used to line-narrow lasers both in bulk systems and/or in integrated optics. Furthermore, efficient, low-power switching elements, e.g. efficient optical switches, appear to be feasible using the present concept. Still further, the present invention can be used to produce a narrow linewidth laser which is exceedingly coherent (or monochromatic) such that it can be efficiently used in fiber optic communication systems, of which the bit rate is limited only by the dispersion effects due to the line width of the semiconductor laser used to transmit the data. Since the line width can possibly be made to be narrower than previous lasers, the present invention, which incorporates the guided-mode resonance filter within the laser, has the potential to provide a higher bit rate and thus a more efficient fiber optic communication system than currently feasible. Even still further, the present invention can be incorporated into thin-film designs to improve their filtering and polarization effects.

The diffraction efficiency maximum point, or passband, can be controlled by the magnitude of the periodic modulation of the permittivity of the present invention. The diffraction elements or gratings can, in principle, be made lossless by making them very small and thin (thickness on the order of 1 μm) and thus compatible with semiconductors or integrated optics. Thus, an important application of the present invention is to place the grating with semiconductor lasers to line-narrow the lasers and thereby improve their performance. Since only small modulation is needed, it may be possible to dynamically alter the passband and thus scan in frequency. Still further, the guided-mode resonance filters of the present invention are believed to have a narrower line width than the classical Fabry-Perot filters due to the spatial modulation being arbitrarily small. By using appropriate dielectric coatings, the present guided-mode resonance (GMR) filters can operate as substantially 100% reflecting narrow-line mirrors to replace the retroreflector in a laser cavity and provide the filtering needed within the laser simultaneous with laser beam generation.

In order to achieve tunability in the GMR filters according to exact modeling techniques described herein, the thickness, periodic structure, permittivity and/or angle of incidence, etc. may be changed to target the passband to a specific frequency application. Thus, changes in any of these parameters allows changes in diffraction efficiency at various passband frequencies of the GMR filter. The present invention also postulates a method of producing a tuneable output wave, possibly within a laser cavity to line-narrow the laser output. Changing various features such as, but not limited to, thickness, angle of incidence, permittivity and spacing between the periodic structures allows for tunability to produce a tuneable output wave according to the present invention.

Broadly speaking, the present invention contemplates a guided-mode resonance filter for producing tuneable output waves comprising a grating having a thickness and periodicity of the order of the light wavelength and a permittivity typical of dielectric media in the visible and infrared spectral regions. The grating region must have higher average permittivity than both the materials adjacent to the grating on either side, that is, the grating must be in a waveguide geometry. An input wave can be directed at an arbitrary angle of incidence upon the grating. By changing the thickness, periodic structure, permittivity and/or angle of incidence of the grating, a tuned output is produced from the input wave. The filtered or tuned narrowband output waves become the useful waves in typical applications.

As defined herein, periodic structure is a generic term defining all the physical characteristics of the present grating. Thus, changes in periodic structure may include changes in grating spacing and/or pitch. In addition, changes in periodic structure may include changes in permittivity modulation occurring in the present resonance filter. Also, guided-mode resonance filter, as defined herein, may include either a static or dynamically tuneable filter. The present invention, i.e., filter operates as either a passive filter or tuning element, or the invention can be dynamically altered to form a dynamic filter.

The tuneable (filtered) output wave will typically appear as a backward diffracted wave with high efficiency only around the resonance peak. The unfiltered part of the input light not satisfying the resonance condition will pass through the transmissive filter and can be discarded. The tuneable resonance filter further comprises a support structure and, if needed, a thermoelectric cooling device coupled to the grating. The support structure may include a semiconductor of larger surface dimension than the grating, the semiconductor possibly including a semiconductor laser configured adjacent the grating for providing the input wave to be tuned by the grating. The periodic planar structure may include a surface having a plurality of equally spaced grooves which, along with thickness and permittivity of the grating, can be changed. The grating can be rotated to allow changes in angle of incidence. The basic filter structure is periodic in space with the permittivity varying but repeating itself in a cyclical fashion. The repeat distance is called the period, or grating spacing of the grating. The maximum deviation of the permittivity from its average value is called the modulation amplitude. In some cases, for special media, the period can be dynamically altered.

The present invention also contemplates a method of producing a tuneable output wave comprising the steps of providing a planar, rotatable diffraction grating with specific thickness, a plurality of equi-distant periodic structures constituting the grating, and a permittivity typical of dielectric materials in the visible and infrared spectral regions; the average permittivity of the grating region being higher than those of the adjacent regions. An input wave is directed upon the surface of the grating at an angle of incidence which varies depending upon the position of the rotatable diffraction grating. Changes in the distance between equi-distant structures (period) and permittivity of the grating region and/or changes in the angle of incidence cause a tuneable output wave in accordance with these changes. The method further comprises directing at least two laser beams incident upon a photorefractive crystal to produce a grating of changing grating spacing by changing the angle of incidence of at least one of the laser beams. This method implements tunability. Still further, the method comprises computing wavelengths of the input waves which are redirected as tuneable output waves having a substantially high diffraction efficiency. The diffraction efficiency is a function of the thickness, grating period, permittivity and angle of incidence. The tuneable output wave includes at least one substantially narrow window of passband frequencies corresponding to wavelengths of the input wave which are redirected as tuneable output waves having a substantially high diffraction efficiency.

The present invention also contemplates a method of producing a narrowband tuneable laser providing at least one partially transmissive concave mirror, by providing a planar diffraction grating spaced apart from and facing the concave portion of the mirror. The grating has a thickness and a permittivity typical of dielectric materials in the visible and infrared spectral regions. Still further, the present method uses an optical wave source, typically a laser medium, between the concave mirror and the grating, allowing for an input broadband optical wave to be directed from the wave source upon the grating. The input broadband optical wave is backward diffracted from the grating as an output narrowband optical wave in accordance with changing of the grating thickness, changing of the grating permittivity, or changing of the grating spacing. Both the directing of the input broadband signal upon the grating and the backward diffraction of the input broadband wave from the grating surface can be repeated to continuously produce a tuned output narrowband optical reflected wave between the grating and the mirror. The portions of this tuned output narrowband optical reflected wave can be transmitted through the partially transmissive concave mirror as output from the narrowband tuneable laser.

Producing the backward diffracted filtered wave in accordance with the present invention comprises selecting a specific grating thickness, permittivity, grating spacing, and/or angle of incidence to produce a targeted narrowband set of output wavelengths. The output wavelengths correspond to a set of wavelengths whose reflected wave diffraction efficiency is substantially high at select input wavelengths.

BRIEF DESCRIPTION OF THE DRAWINGS

Other objects and advantages of the invention will become apparent upon reading the following detailed description and upon reference to the accompanying drawings, in which.

DETAILED DESCRIPTION OF PREFERRED EMBODIMENTS

Figure 1:
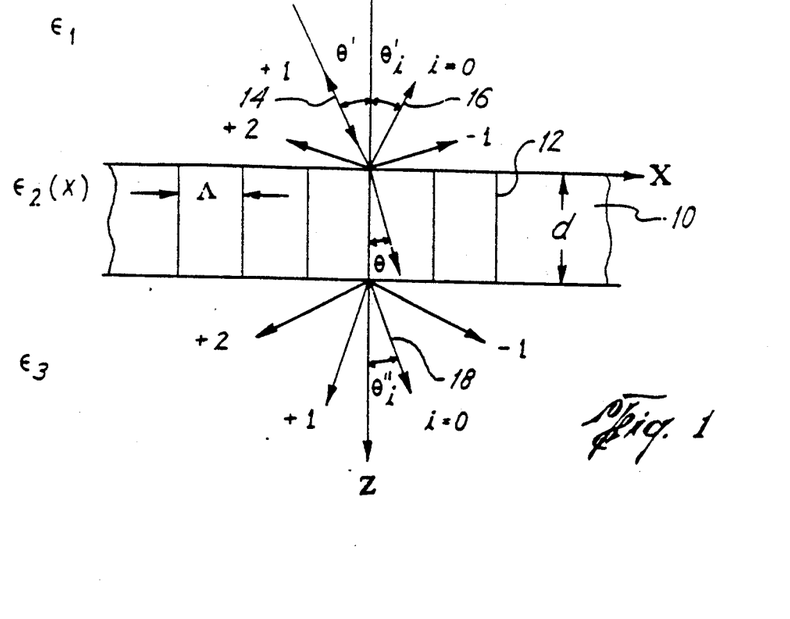
FIG. 1 is a diffraction grating as a tuneable guided-mode resonance filter of the present invention.

It is important when attempting to understand the filtering characteristics of a diffraction grating, such as the grating shown in FIG. 1, that an analysis be done to predict the presence or absence of naturally occurring anomalies. A more exact prediction of anomalies is provided under the rigorous coupled-wave analysis as utilized for the present invention.

The unslanted planar diffraction grating depicted in FIG. 1 has a relative permittivity in the grating region ($0 \leq z \leq d$) given by $$\epsilon_2(x) = \epsilon_0 + \Delta\epsilon \cos Kx,$$

where $\epsilon_0$ is the average relative permittivity, and $\Delta\epsilon$ is the modulation amplitude and $K = 2\pi/\Lambda$, where $\Lambda$ is the grating period. FIG. 1 illustrates an optimal (lossless) dielectric grating with sinusoidal permittivity and an obliquely incident wave with TE polarization; thus the wave equation is:

$$\Delta^2 E_y(x,z) + k^2 \epsilon_2(X) E_y(x,z) = 0 \qquad (1)$$

where $E_y(x,z)$ is the total electric field in the grating region, $k = 2\pi/\lambda$ and $\lambda$ is the free-space wavelength. As a result of the Floquet theorem, the wave vectors of the diffracted waves inside the grating may be represented by the vector Floquet condition, $\bar{\sigma}_i = \bar{k}_2 = i\bar{k} - (k_{2x} - iK)\hat{X} + (k_{2z})\hat{Z}$, where $\bar{\sigma}_i$ is the wave vector of the ith space-harmonic component, $k_2$ is the wave vector of the zeroth-order (i=0) space-harmonic component having a magnitude of $$k_2 = k\sqrt{\epsilon_0}, \quad k_{2x} = k_2\sin\theta, \quad k_{2z} = k_2\cos\theta,$$

and $\theta$ is the angle of the zeroth-order wave vector in the grating.

In the rigorous coupled-wave approach, the total electric field inside the grating is expressed as:

$$E_y(x,z) = \sum_{i=-\infty}^{\infty} S_i(z)\exp(-j\bar{\sigma}_i \cdot \bar{r}) \qquad (2)$$

$$= \sum_{i=-\infty}^{\infty} S_i(z)\exp\{-j[(k_{2x} - iK)x + (k_{2z})z]\}$$

where $S_i(z)$ is the amplitude of the inhomogeneous wave of the ith space-harmonic component of the total electric field. Substituting the coupled-wave expansion field (Eq. (2)) and the permittivity in the grating region into the wave equation (Eq. (1)) gives the coupled-wave equation:

$$\frac{1}{2\pi^2}\frac{d^2S_i(z)}{dz^2} - j\frac{2}{\pi}\left(\frac{\sqrt{\epsilon_0}\cos\theta}{\lambda}\right)\frac{dS_i(z)}{dz} +$$

$$\frac{2i(m-i)}{\Lambda^2}S_i(z) + \frac{\Delta\epsilon}{\lambda^2}[S_{i-1}(z) + S_{i+1}(z)] = 0$$

where $$m = (2\sqrt{\epsilon_0}\ \Lambda\sin\theta/\lambda).$$

In the homogeneous regions (1 and 3), the total fields can be written as:

$$E_1 = \exp(-j\bar{k}_1 \cdot \bar{r}) + \sum_{i=-\infty}^{\infty} R_i\exp(-j\bar{k}_{1i} \cdot \bar{r})$$

$$= \exp\{-j[k_1(\sin\theta x + \cos\theta z)]\} +$$

$$\sum_{i=-\infty}^{\infty} R_i\exp\{-j(k_2\sin\theta - iK)x +$$

$$j[k_1^2 - (k_2\sin\theta - iK)^2]^{\frac{1}{2}}z\}$$

and $$E_3 = \sum_{i=-\infty}^{\infty} T_i\exp[-j\bar{k}_{3i} \cdot (\bar{r} - d\hat{z})]$$

$$= \sum_{i=-\infty}^{\infty} T_i\exp\{-j(k_2\sin\theta - iK)x -$$

$$j[k_3^2 - (k_2\sin\theta - iK)^2]^{\frac{1}{2}}(z - d)\}$$

where $R_i$ denotes reflected wave amplitudes in region 1 (having permittivity $\epsilon_1$) and $T_i$ the transmitted wave amplitudes in region 3 (having permittivity $\epsilon_3$). It is important to note that average permittivity in regions 1 and 3 is less than permittivity within the grating or region 2. Thus, $\epsilon_2 > \epsilon_1$ and $\epsilon_2 > \epsilon_3$. Applying the usual electromagnetic boundary conditions at $z=0$ and $z=d$, leads to four infinite sets of linear equations. By using the approach described by T. Gaylord and M. Moharam, "Analysis and Applications of Optical Diffraction by Gratings", Proc. IEEE, Vol. 73, 894–937 (1985), the wave amplitudes $S_i$, $R_i$, and $T_i$ can be found.

The diffraction efficiency is defined as the diffracted power of a given order divided by the input power, and thus the diffraction efficiencies in regions 1 and 3 are:

$$DE_{1i} = Re[(\bar{k}_{1i} \cdot \hat{z})/(\bar{k}_{10} \cdot \hat{z})]R_iR_i^* \quad (3)$$

$$= Re(\{1 - [\sin\theta - i\lambda/(\sqrt{\epsilon_1}\ \Lambda)]^2\}^{\frac{1}{2}}/\cos\theta)R_iR_i^*$$

and $$DE_{3i} = Re[(\bar{k}_{3i} \cdot \hat{z})/(\bar{k}_{10} \cdot \hat{z})]T_iT_i^* \quad (4)$$

$$= Re(\{(\epsilon_3/\epsilon_1) - [\sin\theta - i\lambda/(\sqrt{\epsilon_1}\ \Lambda)]^2\}^{\frac{1}{2}}/\cos\theta)T_iT_i^*$$

where $T_i^*$ and $R_i^*$ are the conjugate of $T_i$ and $R_i$, respectively.

Therefore, according to the rigorous coupled-wave theory described above, diffraction efficiencies (DE) can be obtained for both the forward-diffracted zeroth-order and backward-diffracted zeroth-order ($DE_{30}$ and $DE_{10}$). The diffraction efficiency equations indicate their dependance on certain parameters. According to the present invention, diffraction efficiency is a function of, inter alia, thickness of the grating (d), grating period ($\Lambda$), permittivity $\epsilon$, and angle of incidence ($\theta'$). Shown in FIG. 1, grating 10 illustrates a plurality of periodic structures 12, equally spaced within the grating 10. The periodic structures 12 are spaced equi-distant $\Lambda$ within the grating as shown. Also, grating 10 has a finite thickness (d).

Common to all gratings is the formation of the spectrum and diffracted orders. Shown in FIG. 1 are several diffracted orders (i), ranging from $-1$ to $+2$. It is important to note, however, that additional or fewer diffraction orders can exist when an incident wave 14 strikes the grating 10. The zeroth-order (i=0) backward-diffracted wave is shown by numeral 16. Conversely, forward-diffracted zeroth-order wave is shown as numeral 18. Diffracted orders move depending upon changes in angle of incidence, $\theta'$, of which incident wave 14 strikes grating 10. When some of the higher order evanescent waves (not shown in FIG. 1) correspond to guided modes of the dielectric slab of thickness d containing the grating, the resonances arise. Thus, the fundamental requirement for guided-mode resonances is that the structure is a so-called waveguide grating which has higher average permittivity than the surrounding adjacent regions This means that region 2 in FIG. 1 has higher average permittivity ($\epsilon_2$) than the permittivity of regions 1 and 3 (i.e., $\epsilon_1$ and $\epsilon_2$). The diffraction grating model used in FIG. 1 also shows angle $\theta_i'$; of the wave vector for the ith backward-diffracted wave with respect to the Z axis. Also, $\theta_i''$ is the corresponding forward-diffracted wave angle with respect to the Z axis. Angle of incidence $\theta'$ is arbitrary.

With the aid of rigorous coupled-wave analysis of the grating, a near exact analysis can be performed upon the grating to arrive at a grating model. As a result of that analysis, diffraction efficiency can be expressed in terms of a model or equation as shown above.

Figure 2:
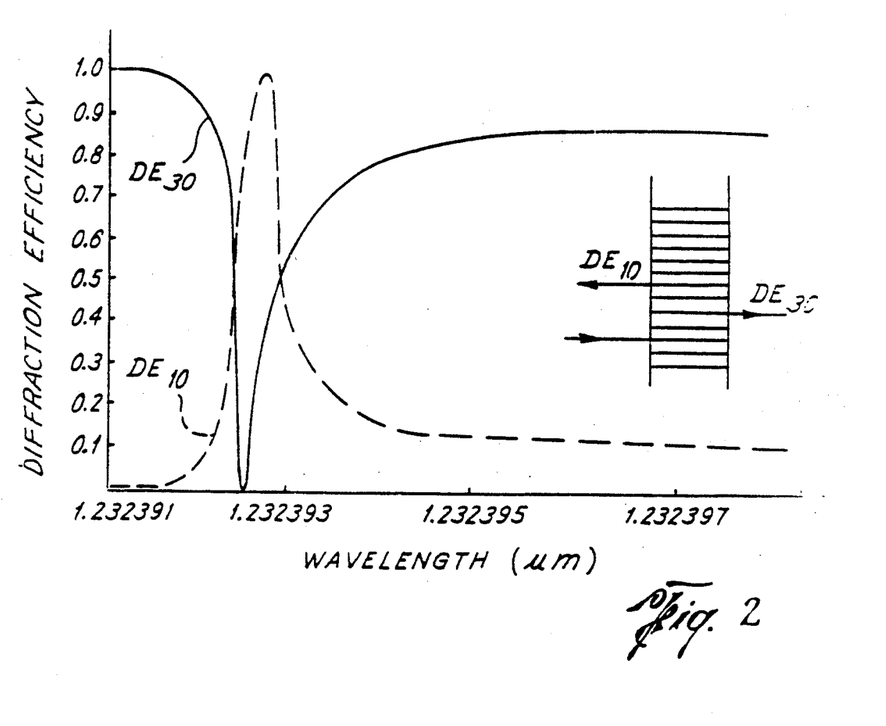
FIG. 2 is a graph illustrating diffraction efficiency as a function of wavelength for an incident wave at 0° angle of incidence upon the grating.

Referring to FIG. 2, diffraction efficiencies for the forward-diffracted wave ($DE_{30}$) and backward-diffracted wave ($DE_{10}$) are shown. At certain wavelengths, $\lambda$, FIG. 2 illustrates that a peak can exist in backward-diffracted efficiency at the same point where forward-diffracted efficiencies are minimized. Thus, a narrow "notch" filter can be established from a diffraction grating of the present invention. Equations 3 and 4 illustrate in mathematical terms diffraction efficiency shown in FIG. 2 when angle of incidence $\theta$ is 0°, $\Delta\epsilon/\epsilon_0 = 0.005$ and mode, i, equals 0. $DE_{30}$ and $DE_{10}$ are both calculated from equations 3 and 4 shown above for selected parameters such as thickness, permittivity, angle of incidence, and grating period. Most importantly, the amplitudes $R_i$ and $T_i$ appear in FIGS. 3 and 4. The rapid variations (resonances) arise in these numerically computed quantities, $R_i$ and $T_i$. The numerically computed amplitudes $S_i$, $R_i$ and $T_i$ are sensitive functions of the basic parameters of the grating and incident wave. FIG. 2 illustrates diffraction efficiency plotted as a function of wavelength for both forward-diffracted wave $DE_{30}$ and backward-diffracted wave $DE_{10}$ FIG. 2 illustrates change in diffraction efficiency as a function of changes in incident light wavelength, $\lambda$. Diffraction efficiency, or passband maximums and minimums, are shown to move according to changes in the wavelength, λ. In accordance with the present invention, a tuneable "notch" filter can be achieved by changing certain variable parameters of the incident wave and/or grating to whatever application suits the needs of the user. These parameters include wavelength, angle of incidence, thickness, average permittivity of the waveguide grating, and the grating period.

FIGS. 3A–3H illustrate various embodiments utilizing the tuneable GMR filter of the present invention. For example, grating 10 can be placed within a laser cavity 20. A laser medium 22, capable of usual population inversion and lasing, is placed in the cavity as in normal lasers. The relatively broadband atomic line of the laser medium initially generates photons (waves) with corresponding wide frequency band. However, the backward-diffracted and filtered waves or photons, 16, returning from the GMR filter, cause stimulated emission only for the corresponding filter narrow-band region. Thus lasing will be line-narrowed according to the GMR filter and other output frequencies will not be sustained. This is akin to a technique called "injection seeding" in the laser industry except here it is performed by a passive element and not by an auxiliary laser. Due to the fact that GMR filter, or grating can be made very thin, it is expected that a substrate support 24 be mechanically coupled to the back of grating 10. Substrate 24 supports grating 10 and provides rigidity, strength, and mountability. Various materials can be used as the structure for support 24. However, substrate 24 can be selected of materials which suit the fabrication approach chosen for the waveguide grating as appropriate for each application. For example, when a semiconductor laser is involved, support 24 may be made of semiconductor material. The right-hand reflector 28 is optional. When the unfiltered part of the spectrum is needed in the cavity, reflector 28 should be retained.

Figure 3A:
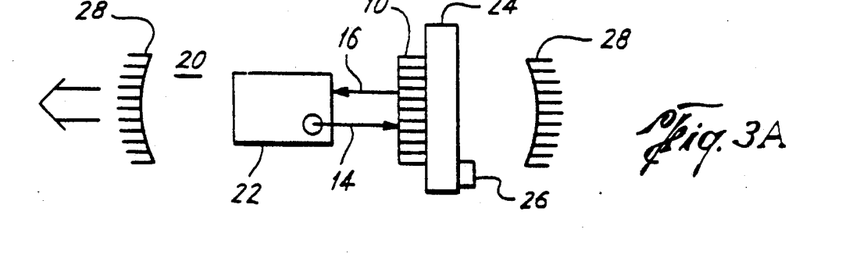
FIG. 3A is a guided-mode resonance (GMR) filter placed within a laser cavity in accordance with the present invention.

Since grating 10 is very thin, it is expected that thermal effects (such as center-wavelength line shifts or frequency drift) due to material thickness expansion caused by heating will be minimal. However, in order to maintain dimensional stability in cases when GMR filters encounter relatively high power levels, classical methods of thermoelectric cooling can be utilized. For example, Peltier cell 26 can be thermally connected to substrate 24 to lend temperature control to grating 10. Whenever the grating temperature exceeds a certain amount, Peltier cell 26 functions to cool grating 10 via conventional thermoelectric means.

Also shown in FIG. 3A, and common in most laser channels, are at least two concave mirrors 28 which face inward and partially surround channel 20. The mirrors can be purely reflective or they can be merely partially reflective such that generated input wave 14 is reflected and maintained within channel 20 until it reaches its exit point. During reflection and redirection, input wave 14 strikes the surface of grating 10 such that the reflecting wave 16 from grating 10 is "tuned" to a specific passband frequency. Subsequent reflections from grating 10 merely act to "re-tune" the incident wave simultaneous with laser wave propagation. Therefore, by placing grating 10 within the propagation laser channel 20, the propagating laser beam is tuned simultaneous with laser beam generation.

Mirrors 28 can be made partially reflective such that a portion of the tuned output narrowband optical wave is transmitted through the partially transmissive concave mirror 28 to produce a targeted narrowband set of output wavelengths emitted from the laser channel 20.

Figure 3B:
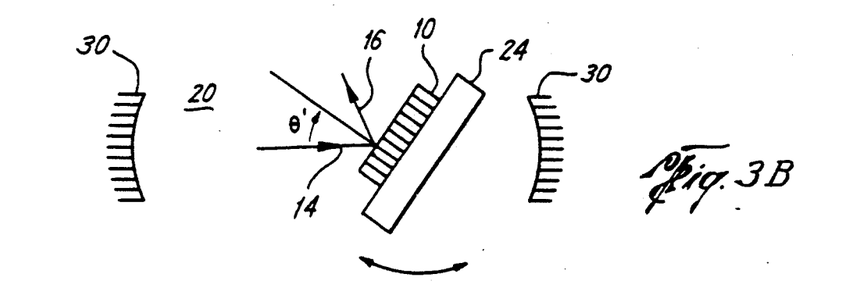
FIG. 3B illustrates rotation of a GMR filter to direct tuneable output waves from a closed laser cavity in accordance with the present invention.

As an alternative to the partially transmissive mirrors 28 of FIG. 3A, FIG. 3B illustrates 100% reflective mirrors 30 surrounding laser cavity 20. By utilizing a rotatable grating 10 and substrate 24, incident, relatively broadband laser wave 14 can be backward-diffracted by the filter 10 to a chosen position outside cavity 20. The rotational aspect of grating 10 thereby allows for its use with conventional mirrors of a standard laser. Furthermore, by rotating grating 10, angle of incidence, θ', can be changed to provide laser tunability and, therefore, to extract a selected line from the lasing medium.

Figure 3C:
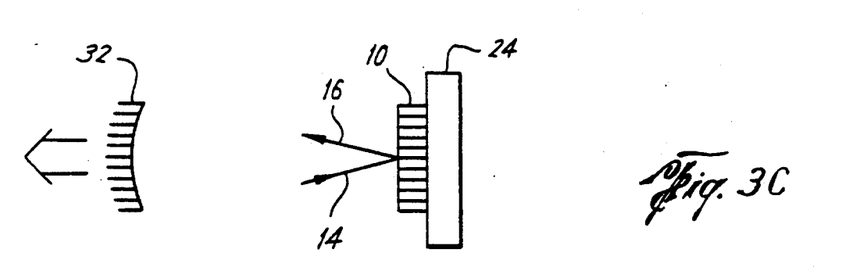
FIG. 3C is a substantially reflective GMR filter placed at one end of a laser cavity in accordance with the present invention.

FIG. 3C illustrates a laser cavity not surrounded by two mirrors as in FIGS. 3A and 3B. Instead, only a single mirror 32 is needed. The other mirror can be replaced by a 100% reflective GMR filter grating 10. Instead of allowing incident wave 14 to be partially transmitted (forward-diffracted) through grating 10 and substrate 24, as shown in FIGS. 3A and 3B, and subsequently reflected by mirrors 28 or 30 back into the active medium of the laser, the embodiment illustrated in FIG. 3C prohibits the forward diffracted wave from returning. Thus, a nearly 100% GMR filter of the present invention can be used to replace one of the reflective mirrors in a laser cavity 20. Partially reflective mirror 32 allows for nearly 100% reflective backward-diffracted wave 16 to be partially transmitted therethrough.

Figure 3D:
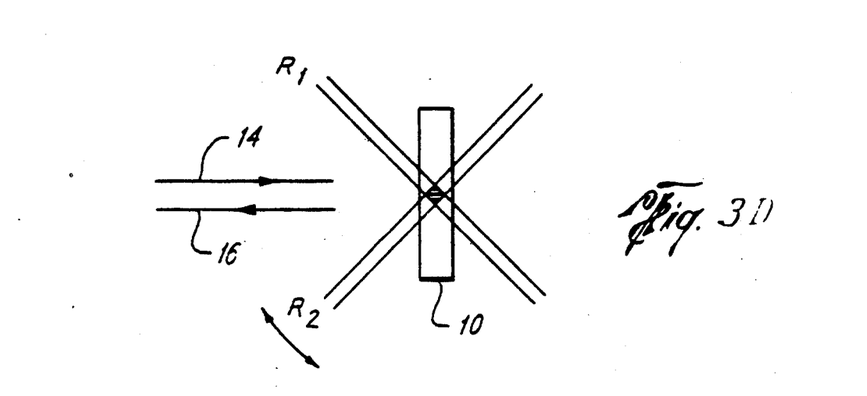
FIG. 3D is a rapidly-tuneable filter using holographic recording laser beams R1 and R2 to dynamically form a tuneable GMR filter according to the present invention.

FIG. 3D illustrates a rapidly-tuneable filter of the present invention using existing electro-optic and acousto-optic beam deflection schemes. Two laser beams intersect in a slab of a photorefractive crystal for recording holographically the GMR filter grating therein. The crystals can be selected to possess fast grating decay time allowing dynamic formation of the GMR filters. Classical electro-optic or acousto-optic schemes can be used to deflect beam $R_2$ to a new angle, thereby tuning the filter. A broadband input wave 14, which strikes the photorefractive material at the intersection of the recording laser beams $R_1$ and $R_2$, produces a filtered, tuneable output wave 16 having varying frequency depending upon the angle of incidence of one of the recording laser beams ($R_2$). There are numerous forms of holographic recording in photorefractive media as indicated by P. Gunter and J. P. Huignard, *Photorefractive Materials and Their Applications I and II* Springer Verlag, 1988.

Figure 3E:
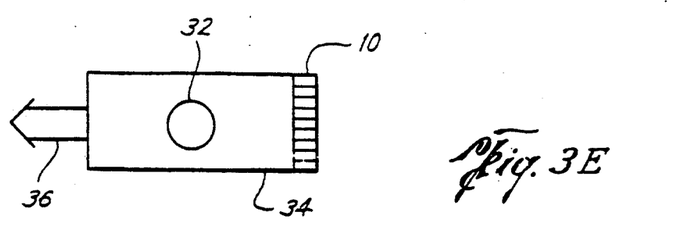
FIG. 3E is a GMR filter placed on a semiconductor substrate adjacent a semiconductor laser to line-narrow the semiconductor laser output in accordance with the present invention.

Another example of the present invention utilizes a semiconductor laser 32 and grating 10 placed adjacent to one another on a semiconductor substrate 34 as shown in FIG. 3E. Since the thin grating 10 requires some form of support in its normal mode of operation, that support may be provided by a semiconductor material such as that shown in reference numeral 34. Also, since semiconductor lasers are common in the art, line-narrowing and/or tuning of those lasers is conveniently provided by placing grating 10 adjacent to the laser upon the semiconductor substrate. By providing grating 10 and semiconductor laser 32 adjacent to one another, output from laser 32 can be line-narrowed producing a highly coherent output wave 36 that then leaves the semiconductor substrate 34.

Figure 3F:
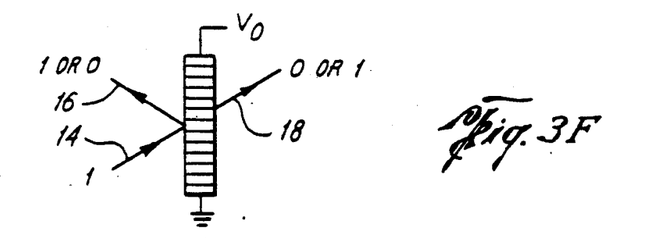
FIG. 3F illustrates a high efficiency optical switch containing forward-diffracted zero order and backward-diffracted zero order in accordance with the present invention.

GMR filters of the present invention also may function as high efficiency switches, as shown in FIG. 3F, of forward-diffracted zero order wave 18 and backward-diffracted zero order 16 in response to incident wave 14.

Either Wave 16 or Wave 18 can have the state of logic (1) or logic (0). Thus, forward and backward-diffracted waves operate similar to an electronic "transistor" to produce a logic (1) or (0) in response to activation of the "gate". In this case, the incident wave 14 could be a narrowline output from another GMRF. Applying a voltage across the grating material, an electro-optic crystal in this case, changes the bulk permittivity and induces the switching.

Figure 3G:
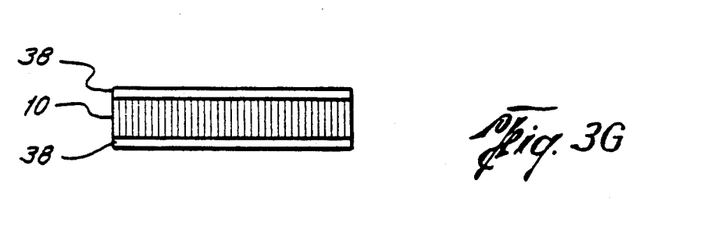
FIG. 3G is an enhanced Fabry-Perot design using GMR filter placed between thin-film layers in accordance with the present invention.
Figure 3H:
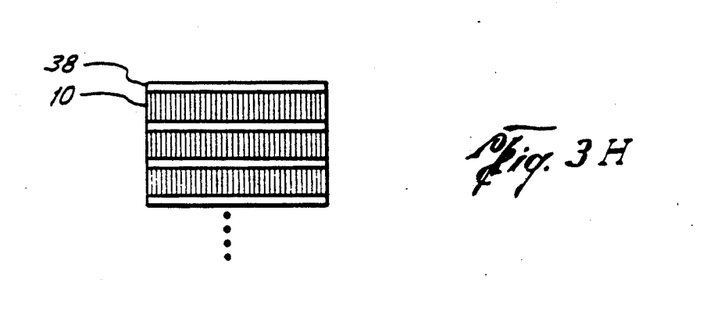
FIG. 3H is an interleaved homogeneous and modulated design using GMR filters placed between thin-film layers in accordance with the present invention.

Still further, GMR filters of the present invention may function as means to enhance classical Fabry-Perot designs in a thin film setting as shown in FIG. 3G. One or more classical thin film layers on each side 38 are shown surrounding a GMR filter 10 of the present invention. In addition, arbitrarily many GMR filters 10 can be interspersed between multiple thin film layers 38 as shown in FIG. 3H. By integrating GMR filters with classical thin-film technology, improved performance is achieved over conventional dielectric mirrors, filters and polarization components. FIGS. 3G and 3H illustrate only two examples of GMR filter thin-film application. However, various other forms of thin-film applications certainly fall within the scope of the present invention.

The foregoing description of the present invention has been directed to particular preferred embodiments. It will be apparent, however, to those of skill in the art, that modifications and changes in both apparatus and method may be made without departing from the scope and spirit of the invention. For example, the basic waveguide grating can be made of any material which provides a periodic structure and dispersion of an incident wave. Also, other forms of variable gratings with similar characteristics fall within the scope of this invention. Rigorous coupled-wave modeling is only but one method of providing exact or near exact modeling of diffraction efficiencies and/or frequency passbands. Still further, those of skill in the art may envision various other embodiments which can be used to tune an input wave via diffraction gratings in waveguide geometry above and beyond those disclosed in FIGS. 3A-3F without departing from the scope of the invention. Therefore, it is the Applicants' intention in the following claims to cover all such equivalent modifications and variations which fall within the true spirit and scope of this invention.

What is claimed is:

1. A guided-mode resonance filter, comprising:
   a grating having a plurality of variable parameters including thickness, periodic structure and permittivity of dielectric materials within said grating;
   an input wave directed at an angle of incidence upon said grating; and
   means for changing at least one said variable parameter to produce a tuned output wave from said input wave.

2. The filter as recited in claim 1, wherein said tuned output wave comprises said input wave diffracted from said grating, whereby said tuned output wave having a substantially high diffraction efficiency at select wavelengths.

3. The filter as recited in claim 1, wherein the permittivity within said grating is higher than the permittivity average value of regions surrounding said grating.

4. The filter as recited in claim 1, further comprising a support structure and a thermoelectric cooling means coupled to said grating.

5. The filter as recited in claim 4, wherein said support structure comprises a semiconductor of larger surface dimension than said grating, said semiconductor including a semiconductor laser means configured adjacent to said grating for providing said input wave incident upon said grating.

6. The filter as recited in claim 1, further comprising means for rotating said grating, whereby said angle of incidence changes.

7. The filter as recited in claim 1, further comprising a voltage supply connected across said grating to change said permittivity and selectively induce variations in said output wave depending upon a state of said voltage supply.

8. The filter as recited in claim 1, wherein said grating is placed between a pair of thin-film layers 9. The filter as recited in claim 8, wherein said thin-film layers are made of single or multiple homogenous dielectric materials.

10. A method of producing a tuneable output wave, comprising the steps of:
    providing a planar, rotatable diffraction grating having a plurality of variable parameters including: thickness, a plurality of equi-distant periodic structures placed within said grating, and permittivity typical of dielectric materials in the visible and infrared spectral regions;
    directing an input wave possessing a characteristic wavelength spectrum upon a surface of said grating at an angle of incidence which varies depending upon a position of said rotatable diffraction grating;
    changing at least one said parameter for producing a tuneable output wave and redirecting said input wave incident upon said grating to produce said tuneable output wave in accordance with said changing step.

11. The method as recited in claim 10, wherein said changing step comprises changing said thickness to produce said tuneable output wave.

12. The method as recited in claim 10, wherein said changing step comprises changing the spacing between said equi-distant structures to produce said tuneable output wave.

13. The method as recited in claim 10, wherein said changing step comprises changing said permittivity to produce said tuneable output wave.

14. The method as recited in claim 10, wherein said changing step comprises changing said angle of incidence to produce said tuneable output wave.

15. The method as recited in claim 10, wherein said diffraction grating comprises a photorefractive crystal.

16. The method as recited in claim further comprising directing at least two laser beams incident upon a photofractive crystal to produce a grating of a changed spacing between the equidistant structures depending upon changing an angle of incidence of at least one laser beam.

17. The method as recited in claim 10, wherein said tuneable output wave includes at least one substantially narrow window of passband frequencies corresponding to wavelengths of said input waves having a substantially high diffraction efficiency.

18. The method as recited in claim 10, further comprising:
    applying voltage across said grating; and changing a digital magnitude output signal of said output wave in accordance with changing said voltage across said grating.

19. A method of producing a narrowband tuneable laser, comprising the steps of:

providing at least one partially transmissive concave mirror;

providing a planar diffraction grating spaced apart from and facing the concave portion of said mirror, said grating having a plurality of variable parameters including thickness, spacing between a plurality of equi-distant structures within said grating, and a permittivity typical of dielectric materials in the visible and infrared spectral regions;

providing an optical laser medium between said concave mirror and said grating;

directing an input broadband optical wave from said laser medium upon said grating surface;

backward diffracting said input broadband optical wave from said grating as an output narrowband optical wave in accordance with changing at least one said variable parameter;

repeating said steps of directing and backward diffracting to continuously produce a tuned said output narrowband optical backward diffracted wave between said grating and said mirror; and transmitting a portion of said output narrowband optical wave through said partially transmissive concave mirror as output from said narrowband tuneable laser.

20. The method as recited in claim 19, wherein said backward diffracting step comprises selecting a specific grating thickness, permittivity and spacing between the equi-distant structures to produce a targeted narrowband set of output wavelengths.

21. The method as recited in claim 19, wherein said output wavelengths correspond to a set of wavelengths whose backward diffracted wave diffraction efficiency is substantially high.

22. The method as recited in claim 21, wherein said diffraction efficiency is greater than 0.8.

23. The method as recited in claim 19, wherein said optical laser medium includes a semiconductor laser.

* * * * *

UNITED STATES PATENT AND TRADEMARK OFFICE
CERTIFICATE OF CORRECTION

PATENT NO. : 5,216,680
DATED : June 1, 1993
INVENTOR(S) : Robert Magnusson, et al It is certified that error appears in the above-indentified patent and that said Letters Patent is hereby corrected as shown below:

In the Abstract, line 1, "filer" should read --filter--

In the Abstract, line 14, "laser In", should read --laser. In--

Column 12, line 16, "layers" should read --layers.--

Column 12, line 55, "claim further" should read --claim 10, further--

Column 12, line 56, "photofractive" should read --photorefractive--

Column 12, line 58, "equidistant" should read --equi-distant--

Signed and Sealed this

Eighteenth Day of January, 1994

Attest:

BRUCE LEHMAN

Attesting Officer

Commissioner of Patents and Trademarks